(12) United States Patent
Bachschmidt et al.

(10) Patent No.: US 9,989,614 B2
(45) Date of Patent: Jun. 5, 2018

(54) METHOD AND APPARATUS FOR ACQUIRING A MAGNETIC RESONANCE DATA SET FROM A TARGET AREA CONTAINING A METAL OBJECT

(71) Applicant: Siemens Aktiengesellschaft, Munich (DE)

(72) Inventors: Theresa Bachschmidt, Erlangen (DE); Mathias Nittka, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 559 days.

(21) Appl. No.: 14/678,351

(22) Filed: Apr. 3, 2015

(65) Prior Publication Data

US 2015/0285890 A1  Oct. 8, 2015

(30) Foreign Application Priority Data

Apr. 3, 2014  (DE) .................. 10 2014 20 6397

(51) Int. Cl.
| | |
|---|---|
| *G01V 3/00* | (2006.01) |
| *G01R 33/565* | (2006.01) |
| *G01R 33/34* | (2006.01) |
| *G01R 33/385* | (2006.01) |
| *G01R 33/48* | (2006.01) |
| *G01R 33/483* | (2006.01) |
| *G01R 33/56* | (2006.01) |

(52) U.S. Cl.
CPC ....... *G01R 33/56536* (2013.01); *G01R 33/34* (2013.01); *G01R 33/385* (2013.01); *G01R 33/4828* (2013.01); *G01R 33/4835* (2013.01); *G01R 33/5608* (2013.01)

(58) Field of Classification Search
CPC .... G01R 33/56; G01R 33/561; G01R 33/565; G01R 33/54; G01R 33/4833
See application file for complete search history.

(56) References Cited

U.S. PATENT DOCUMENTS

| | | | |
|---|---|---|---|
| 2010/0033179 A1* | 2/2010 | Hargreaves ........ | G01R 33/4833 324/309 |
| 2013/0076356 A1* | 3/2013 | Jellus ............... | G01R 33/56563 324/309 |
| 2014/0300357 A1 | 10/2014 | Bachschmidt et al. | |
| 2015/0177354 A1 | 6/2015 | Bachschmidt et al. | |

(Continued)

OTHER PUBLICATIONS

Lu et al., "SEMAC: Slice Encoding for Metal Artifact Correction in MRI," Magnetic Resonance in Medicine, vol. 62, pp. 66-76 (2009).

(Continued)

*Primary Examiner* — Minh N Tang
(74) *Attorney, Agent, or Firm* — Schiff Hardin LLP (57) ABSTRACT

In a method and apparatus for acquiring a magnetic resonance (MR) data set from a target area of a patient containing at least one metal object that distorts the basic magnetic field due to susceptibility differences, a slice selection gradient that rises in one direction is used to select a slice from which MR data are to be acquired. At least for at least one outermost edge slice on one side of the slice stack from which the MR data are to be acquired, the polarity of the slice selection gradient is selected as a function of a primary direction of distortion in the edge slice.

20 Claims, 8 Drawing Sheets

(56) References Cited

U.S. PATENT DOCUMENTS

2015/0301146 A1* 10/2015 Griswold ......... G01R 33/56536
324/309
2016/0223635 A1* 8/2016 Den Harder ......... G01R 33/246

OTHER PUBLICATIONS

Hargreaves et al., "Adaptive Slice Encoding for Metal Artifact Correction," Proc. Intl. Soc. Mag. Reson. Med., vol. 18, p. 3083 (2010).
Hargreaves et al., "Adaptive Slice Encoding for Metal Artifact Correction," ISMRM Poster (2010).
Hargreaves et al., "Accelerated Slice Encoding for Metal Artifact Correction," Journal of Magnetic Resonance Imaging, vol. 31, pp. 987-996 (2010).

* cited by examiner

METHOD AND APPARATUS FOR ACQUIRING A MAGNETIC RESONANCE DATA SET FROM A TARGET AREA CONTAINING A METAL OBJECT

BACKGROUND OF THE INVENTION

Field of the Invention

The invention concerns a method for acquiring a magnetic resonance data set from a target area of a patient containing least one metal object that distorts the basic magnetic field of the magnetic resonance scanner due to susceptibility differences, wherein a slice selection gradient rising in one direction is used to select a slice to be acquired. The invention also relates to a magnetic resonance apparatus and a storage medium for implementing such a method.

Description of the Prior Art and Related Subject Matter

Magnetic resonance imaging is a well-known imaging modality. Radio-frequency excitations are used in order to deflect nuclear spins in an examination subject situated in a basic magnetic field (B0 field) in order to measure signals resulting therefrom. The radio-frequency field of the radio-frequency excitation is generally designated a B1 field. Gradient fields are also used in such imaging. These are superimposed on the basic magnetic field, generally as a linear gradient field. A differentiation is made between the slice selection gradient, the phase-encoding gradient and the read-out gradient. If the magnetic resonance recording is to be performed slice-by-slice, such as is the case with the acquisition method discussed herein, it is, possible to superimpose a slice-selection gradient field so that the overall magnetic field in the homogeneity region rises in one direction. The result is a change in the resonance frequency along the slice-selection direction. Therefore, if a radio-frequency excitation with a specific bandwidth is irradiated, in an ideal case only a clearly determined slice is excited in which the resonance frequencies lie within the excited frequency band.

Problems occur in magnetic resonance examinations when metallic objects are present in the target area, for example metallic implants in a patient. Despite the associated complications, examination of patients with metallic implants has become an important application. In particular, the increasing number of patients with orthopedic implants, for example screws, fixations, artificial joints etc., has led to the development of new techniques designed to reduce the significant image distortions due to such metals, since the high soft-tissue contrast achieved with magnetic resonance imaging is superior to other examination methods. Here, it should be taken into account that other imaging modalities, for example computed tomography, also exhibit severe metal artifacts.

In magnetic resonance imaging, when a metallic object is present in the target area, the image artifacts are primarily caused by the distortion of the static magnetic basic field (B0 field), which in turn is attributable to the great difference in the magnetic susceptibility between body tissue and metal. When acquiring magnetic resonance data from slices, in particular slices in a slice stack, covering the target area, the inhomogeneities of the basic magnetic field also result in a spatial distortion of the slices in the slice-selection direction so that reliable diagnosis by the doctor is frequently not possible with uncorrected magnetic resonance images. The distortion or geometric displacement of the slice that occurs due to the inhomogeneities of the basic magnetic field is proportional to the resonance frequency deviation. The resonance frequency deviation (often also designated the off-resonance frequency) corresponds to the frequency difference between the actual or theoretical resonance frequency of the spins at a specific location, and the actual resonance frequency of these spins. Here, the theoretical resonance frequency of the spins is that which would occur with an optimally homogeneous basic magnetic field, the actual resonance frequency is obtained due to the distortion of the basic magnetic field.

In the prior art, methods have been suggested in order, despite the distortion of the basic magnetic field and hence the slices, to resolve and correctly assign all the information belonging to a slice (distortion correction). One known promising method for this is additionally to switch a phase-encoding gradient in the slice-selection direction. One method based on a two-dimensional TSE sequence is the so-called "SEMAC" method, which, for example, is described in US 2010/0033179 A1 or the underlying article by Wenmiao Lu et al. "SEMAC: Slice Encoding for Metal Artifact Correction in MRI", Magnetic Resonance in Medicine 62: 66-76 (2009). For successful SEMAC correction, it is necessary to select both the number of slices and the additional phase-encoding steps such that the spatial and spectral extensions of the field distortions are completely covered. This entails a significant prolongation of the measuring (data acquisition) time.

Therefore, methods have been suggested for determining the number of phase-encoding steps required in the slice-selection direction by means of a scout scan in order to restrict them to the minimum necessary size. Examples of this can be found in the article by B. A. Hargreaves et al. "Adaptive Slice Encoding for Metal Artifact Correction", Proc. Intl. Soc. Mag. Reson. Med. 18 (2010), page 3083, and in particular the subsequently published German patent application DE 10 2013 205 930.2 and U.S. application 61/918,786. For example, DE 10 2013 205 930.2 describes a scout scan that can be performed extremely quickly with which the read-out gradient is applied in the slice-selection direction, i.e. in the same direction as the slice selection gradient, wherein the slice selection gradient and the read-out gradient have different polarities such that an overall shift of the slice in the same direction is obtained which can be measured.

However, even when using correction methods of this kind, the edge slices of the slice stack present problems. The radiologist will generally place the slice stack as closely as possible around the region of interest because a higher number of layers increases the SAR loading on the patient and hence possibly the measuring time, which is anyway already much longer when using multiple phase-encoding steps in the slice-selection direction. Thus, particularly with strong distortion in edge slices, it can occur that off-resonant spins are not acquired by the excitation of another slice and therefore also cannot be reconstructed when using methods such as SEMAC. Depending upon the distortion of the basic magnetic field and the location of the metal object, spins can be excited which, although their resonance frequency deviations are the same, have different +/− signs. Then, it can happen that, in the case of symmetrical structures, for example, the head of a hip implant, more details are depicted in one direction than in the other direction. So far, no solution to this problem has been known apart from the significant prolongation of the measuring time if a number of (actually unnecessary) additional slices is recorded.

SUMMARY OF THE INVENTION

An object of the invention is to improve magnetic resonance data acquisition from slices, despite the distortion presence of edge slices, which is simple to implement and entails no increase, or only a small increase, in the measuring time.

This object is achieved according to the invention by a method of the above type wherein, at least for at least one outermost edge slice on one side of the slice stack to be recorded, the polarity of the slice selection gradient is selected as a function of a primary direction of distortion in the edge slice.

The distortion situation in the outermost edge slices, for example the 1 to 3 outermost edge slices on at least one side of the slice stack, in particular each side of the slice stack, is analyzed and the polarity of the slice selection gradient, i.e. the direction in which this rises, is selected as a function thereof. This is based on the knowledge that whether a spin is excited, therefore whether a suitable resonance frequency is present at one location within the excitation bandwidth of the radio-frequency device, is determined by the relevant field that is present at that location. The relevant field has a contribution from the basic magnetic field of the magnetic resonance scanner, which can be assumed to be homogenous, but primarily results from the slice selection gradient that is present and the susceptibility-induced interference field. Proceeding from the middle of the slice and in the case, for example, of positive susceptibility-induced interference fields in both directions, then at the side toward which the slice selection gradient rises linearly, this relevant field causes the resulting resonance frequencies to rise more quickly and therefore also leave the excitation bandwidth of radio-frequency excitation more quickly. The opposite effect occurs on the other side, since the positive deviations are reduced here due to the lower slice selection gradient there. Therefore, in this simple example, this means that the range in which the spins are actually excited is shortened in one direction but enlarged in the other direction. If this "shortening direction" is the outward direction in the slice stack, the described extinction occurs since no excitation takes place there and therefore no signals are received. Going beyond this example, other cases are conceivable in which the slice distortion at least partially extends over the center of the desired slice, or even over the opposite edge of the desired slice.

Usually, the course of the susceptibility-induced interference fields and therefore the susceptibility-induced resonance-frequency deviations, will be more complex and therefore will indicate, at least for one side of the slice stack but generally for the primary main direction of distortion of the edge slice, whether the susceptibility-induced interference field for this slice lies more in the positive range or more in the negative range, and hence in which direction in the slice-selection direction the slice is more distorted. The basis of the invention is to select the polarity of the slice selection gradient such that the effect of the combination of the susceptibility-induced interference fields and of the slice selection gradient is such that the spins are also actually excited at the great possible number of locations to be measured for the at least one edge slice. In this way, extinctions are reduced or ideally avoided completely.

The polarity of the slice selection gradient thus can be selected so that, in the case of a mainly positive resonance frequency deviation, due to the distortion, the slice selection gradient increases, from at least one edge slice lying on one side of the slice stack toward the other side of the slice stack. With a mainly negative resonance frequency deviation, due to the distortion, on at least one edge slice lying on one side of the slice stack, the slice selection gradient rises to this side of the slice stack. Therefore, if the resulting magnetic field, which is "seen by" the spins, and hence the resonance frequency, deviates more in the positive direction, this can be at least partially compensated in the outward direction by lower values of the slice selection gradient and vice versa. For example, if positive resonance-frequency deviations lie on the left side of the slice stack, the slice selection gradient is selected such that the gradient profile from left to right runs from the negative range into the positive range. This does not intensify, but weakens, the off-resonance effect and more off-resonant spins are excited by the radio-frequency excitation (and possibly refocused).

Frequently, the metal objects do not lie in the center of the target area and so the impact thereof is higher toward one side of the slice stack than to the other side of the slice stack or the susceptibility-induced interference fields on one side of the slice stack are stronger in the slice-selection direction. Then, it can be sufficient, in particular after an analysis of the distortion of edge slice or edge slices of the side lying closer to the metal object side or on both sides of the slice stack in the slice-selection direction, to select the polarity of the slice selection gradient to be the same for all slices. This means that data from all slices of the slice stack are acquired with a specific polarity that is selected on the basis of an evaluation of the distortion of at least one edge slice on each side. If this concludes the measurement, the measuring time is not prolonged but, due to the choice of the polarity of the slice selection gradient, signal losses from the slices to be recorded are reduced.

However, if the choice of slice selection gradient causes information, even though it may be less information, to be lost on the opposite side of the slice stack because off-resonant spins cannot be excited, it can be expedient either to select two different polarities of the slice selection gradient on both sides of the slice stack or to repeat the measurement of at least one edge slice on one side once again with the reverse polarization of the slice selection gradient. Therefore, at least one outermost edge slice of at least one side is measured again with the other polarity of the slice selection gradient, in particular when the main direction of distortion of the side to be recorded again is opposing the main direction of distortion that is decisive for the choice of polarity during the recording of all slices and/or using magnetic resonance technology that reduces the recording time. Therefore, to minimize the signal extinction, the recording can be repeated with reversed slice selection gradients for at least a part of the slices, which means that, in the case of a polarity opposite to the two acquisitions with the slice selection gradients, encoding of the edge slices of one side is sufficient, under some circumstances. Here, it is suggested that, on the repeat recording of magnetic resonance data with reverse polarity of the slice selection gradient, methods to reduce the measuring time are employed in order to keep the overall increase in the measuring time small. For example, techniques such as "Compressed Sensing" are suitable for this purpose; a further acceleration can be enabled by parallel RF transmission and/or magnetic resonance signal reception techniques.

As noted, for the determination of the primary direction of distortion of the edge slices, it is preferable to use the outermost edge slices of both sides of the slice stack in the slice-selection direction in order to determine the further procedure, in particular as to whether all slices should be measured with the same polarity of the slice selection gradient or whether measurements with multiple polarities of the slice selection gradient are required. If only one side of the slice stack is considered, although it is possible to avoid extinctions by a suitable choice of polarity, it is possible that stronger extinctions on the opposite side of the slice stack will be overlooked. Here, distortions of the slice toward the interior of the slice stack are obviously not as critical since these slices will be measured anyway and in the context of a distortion correction, for example the above discussed correction, are then present and can be correctly assigned.

In an embodiment of the invention, it can be provided that the main direction of distortion is determined by analysis and/or integration of a, in particular slice-specifically determined, resonance-frequency distribution, in particular in the phase-encoding direction and/or that the primary direction of distortion and/or the polarity is determined on the basis of at least one property of the target area and/or the metal object from a database. The primary direction of distortion can, therefore, be determined on the one hand from specific knowledge of the current imaging task, to be specific from at least one resonance-frequency distribution, which, obviously, can itself by determined by computational means, for example in the context of a simulation, but preferably in one scout magnetic resonance measurement. The analysis of a resonance-frequency distribution of this kind of an outermost edge slice by integration and/or other analytical methods indicates whether the resonance frequencies are deviating more in the positive or more in the negative direction as far as this slice is concerned. In order to finally determine the polarity of the slice selection gradient for the overall recording, it is possible to make comparisons between the outermost edge slices assigned to the opposite sides in order in this way to balance the signal extinctions against one another, wherein the degree of the deviations can also be relevant and also taken into account in the integration. If multiple outermost edge slices are considered, for example the two to three outermost edge slices on each side, the respective slices can then be removed from the discussion if none of resonance-frequency deviations would result in a distortion of the slice beyond the boundaries of the slice stack.

However, as noted, it is also conceivable for the computer that implements the method to retrieve stored information about polarity from a database, which can be created, for example, by computational methods, as indicated above, or from empirical values. This is due to the fact that, in magnetic resonance imaging, imaging tasks frequently represent similar or comparable facts so that, for example, in the case of metal heads of hip implants it can generally be assumed that there is a quadrupole-type field distribution with negative resonance-frequency deviations to the right and left of the hip implant in the coronal plane. It is also conceivable for the polarity of the slice selection gradient also to be selected without specific analyses for the present imaging task, with sagittal recordings such that the slice selection gradient rising toward the left end of the slice stack. In addition to this specific example, there are numerous medical questions with which similar configurations and similar slice choices are present, so that it is possible to make use of a wealth of experience stored in a database.

Expediently, at least for the edge slices, in particular along the phase-encoding direction, the resonance-frequency distribution can be determined in the context of a scout magnetic resonance measurement. The purpose of a scout magnetic resonance measurement of this kind is to quantify, at least roughly, the positive and negative off-resonances slice-specifically with respect to amplitude and frequency without this taking too much time. Scout magnetic resonance measurements of this kind with which the deviations of the resonance frequency from the reference value can be determined are already partially known in the prior art and can also be used within the context of the invention. For example, the afore-mentioned, previously published DE 10 2013 205 930.2 uses a specific measuring process in order to determine the number of phase-encoding steps in the SEMAC method. Scout magnetic resonance measurements of this kind that can be performed quickly can, for example, be based on a spin echo sequence, since the measurement of B0 field maps in the vicinity of metal is very time-consuming. It is also particularly expedient for the read-out gradient applied in the slice-selection direction to have the opposite polarity from the slice selection gradient in the scout magnet resonance measurement, since then the resulting deviations are expressed in the same direction and can be measured. However, approaches are also known with which the read-out gradient applied in the slice-selection direction has the same polarity as the slice selection gradient but with which the resonance frequency deviation can still be determined. Obviously methods of this kind can also be used to perform the scout magnetic resonance measurement.

Here, a specific resolution in the phase-encoding direction is not mandatorily necessary since methods are also known that completely dispense with a read-out gradient (see for example B. A. Hargreaves et al., "Adaptive Slice Encoding for Metal Artifact Correction", Proc. Intl. Soc. Mag. Reson. Med. 18 (2010), side 3083). The final object is to be able to determine along the slice-selection direction how strongly and in which direction the individual slices are primarily distorted.

Alternatively and/or additionally, as already explained, it is conceivable for the resonance-frequency distribution and/or the database entries to be at least partially determined in the context of a simulation calculation. Corresponding simulation techniques are already extensively known in the prior art and can therefore also be used in the context of the present invention.

Finally, reference is made once again to the fact that, instead of integrating the resonance-frequency deviations in the phase-encoding direction, it is also conceivable for other characteristics to be taken into account for the determination of the main direction of distortion, for example a maximum resonance frequency deviation in one direction and the like.

It is particularly expedient for the SEMAC method to be used to correct the slices with respect to distortion. This method, as noted, uses multiple phase-encoding steps in the slice-selection direction for each slice in order to be able to scan the distorted slices as extensively as possible and to correct them the context of a distortion correction. Ultimately, therefore, SEMAC is a "through-plane" type of slice correction.

Particular advantages are obtained if, during a scout magnetic resonance measurement, the results of this are also evaluated with respect to the choice of the number of phase-encoding steps for the different slices in the SEMAC method. This is then possible if the scout magnetic resonance measurements already addressed, which were suggested in the post-published prior art for the estimation of the number of phase-encoding steps, are also used to determine the main direction of distortion. Then, therefore, the results of the scout magnetic resonance measurement are used twice.

To summarize, the present invention provides a method for use in clinical practice with which significant image artifacts due to B0 field distortions, such as those that occur with larger metallic implants, for example a hip replacement and/or other metal objects, can be reduced. In this case, a mere rough estimation of the resonance-frequency deviations, be it by means of a scout magnetic resonance measurement or due to empirical values/calculations in a database, can be sufficient in order, by means of this rough knowledge of the off-resonance, described by the main direction of distortion of the edge slices, to select the polarity of the slice-selection direction so that the overall area of signal extinction is reduced and the image quality is improved. This enables the visualization of the anatomy in direct environment of the metal object, which can be relevant for the diagnosis, for example in the case of rejection reactions, infections or stress fractures.

In addition to the method, the present invention also concerns a magnetic resonance apparatus having a control computer that operates a scanner of the apparatus so as to implement the method according to the invention. All embodiments with respect to the method according to the invention apply to the magnetic resonance apparatus according to the invention, with which the aforementioned advantages thus can also be obtained. The control computer determines, for example by a distortion determination unit thereof, the primary direction of distortion, so that a selection unit of the computer then selects a suitable polarity, and is able to adjust it.

The invention also concerns a non-transitory, computer-readable data storage medium encoded with programming instructions that cause the method according to the invention to be implemented when the instructions are executed by a computation device. Again, all embodiments of method according to the invention apply. The non-transitory data storage medium can be, for example, a CD-ROM.

DESCRIPTION OF THE PREFERRED EMBODIMENTS

Figure 1:
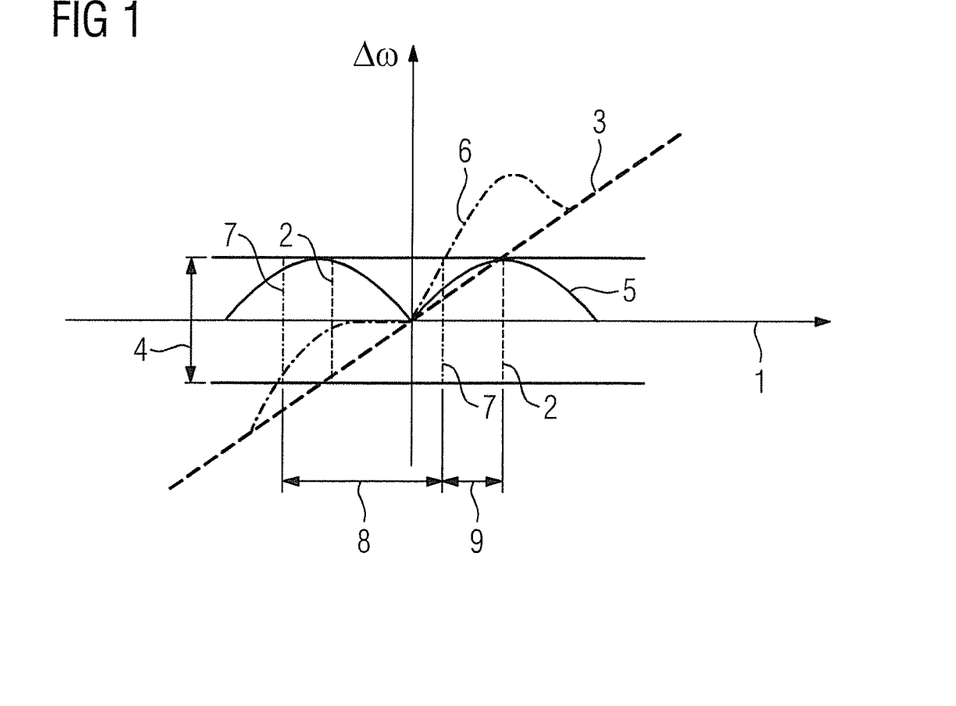
FIG. 1 illustrates resonance-frequency modifying effects and their impacts.
Figure 2:
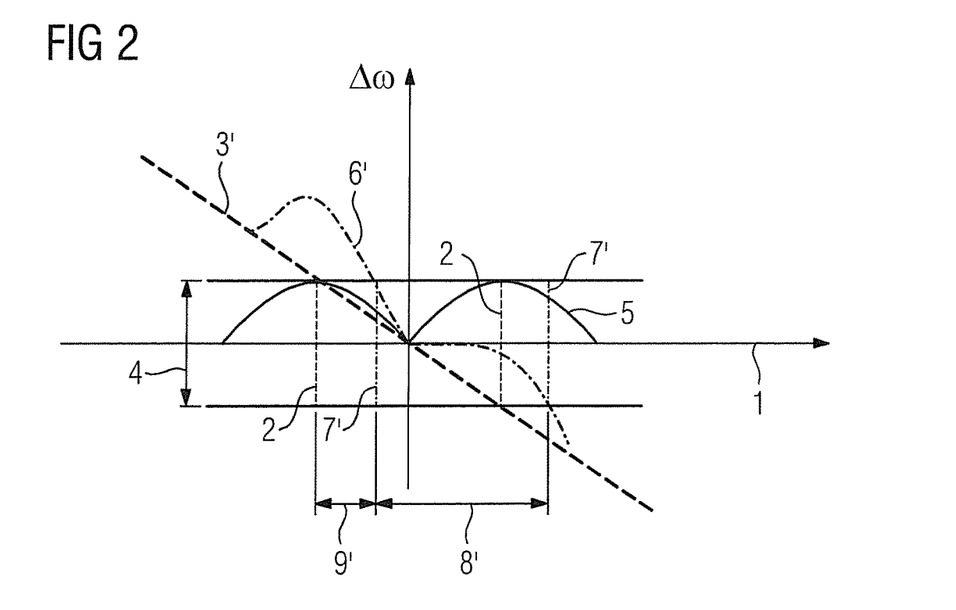
FIG. 2 is a graph corresponding to FIG. 1 with reverse polarity of the slice selection gradient.

FIG. 1 illustrates the problem on which the invention is based and, together with FIG. 2, the solution to the problem. Therein, different courses of resonance-frequency deviations are plotted against the slice-selection direction 1. It is assumed that without further effects a homogeneous basic magnetic field would be present and therefore the overall resonance frequency deviation would be 0. In order to be able deliberately to excite a slice bounded by the dashed lines 2, a slice selection gradient that modulates the resonance frequencies spatially is applied in the slice-selection direction 1, as illustrated by the linear course 3. Now, in the event of no further disruption effects being present, on excitation with a bandwidth indicated by the double arrow 4, the spins would be affected as desired by the radio-frequency excitation within the slice marked by the dashed lines 2. However, in the present case, there is a metal object in the target area, for example an implant, which due to the susceptibility differences, also effects a spatial modulation of the resonance frequency, which is indicated, for example, by the course 5, therefore here there is an increase in the magnetic field effectively seen by the spins, which also results in a displacement of resonance frequencies toward the positive.

Consideration of the two spatial modulation effects jointly results in the course 6. Now, reference to the excitation bandwidth radio-frequency excitation in turn causes the nuclear spins to now be excited only in the region 8 bounded by the straight lines 7, which does not correspond to the slice originally desired.

If now, as usual, a slice stack were acquired and if the slice shown here is the outermost right slice, no magnetic resonance data are obtained in the region 9 due to the displacement of resonance frequencies. No signal extinction is present there, because the course 5 of the susceptibility-induced spatial frequency modulation and the course 3 of the gradient are extremely quickly added to resonance frequencies of the spins lying outside the excitation bandwidth of the radio-frequency excitation.

Precisely with strong susceptibility effects, this can result in signal extinction for all the interesting regions.

FIG. 2 now shows the same case, only the polarity of the slice selection gradient has been reversed with the result that the associated course 3' of the spatial frequency modulation now runs from right to left from the negative into the positive. This results in the entire spatial frequency modulation according to the course 6', which means that the spins actually excited according to the excitation bandwidth indicated by the double arrow 4 lie in the region 8' indicated by the straight lines 7'. Therefore, if this once again relates to the right outermost edge slice of the slice stack, the signal extinction described according to FIG. 1 is no longer present, since now the negative displacement due to the course 3' of the slice selection gradient and the positive displacement of the course 5 of the susceptibility-induced frequency modulation cancel each other out and even extend the region of the slice there.

The spins in the region 9', which now cannot be measured with this slice, would be measured in the context of the adjacent slice on the left.

Therefore it is demonstrated that solely by changing the polarity of the slice selection gradient, regions in edge slices previously affected by signal extinction can now also be measured once again. Therefore, in accordance with the present invention, the polarity of the slice selection gradient is selected such that signal extinction such as described in FIG. 1 can be avoided to a large extent.

It is again to be noted that the change in the polarity of the slice-selection direction in the absence of susceptibility-induced resonance-frequency deviations does not change the image quality so that there are no drawbacks with respect to the image quality associated with the procedure. Previously, the direction of the slice selection gradient, namely from where to where it rises, had to be fixed in advance, while in accordance with the invention this advance fixing is abandoned in order also to be able to acquire magnetic resonance data from regions that were previously affected by signal extinction.

Figure 3:
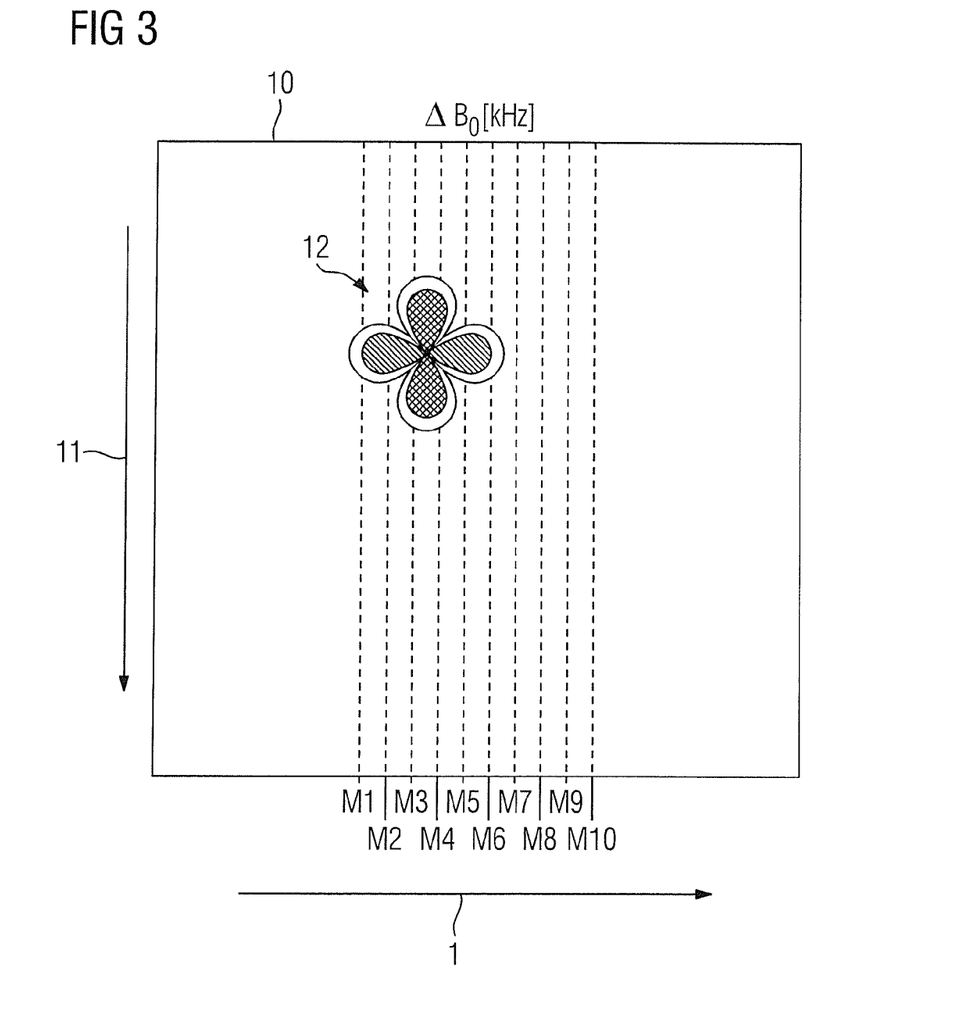
FIG. 3 shows a simple basic magnetic field map with marked slices to be recorded.

This is explained again in more detail with reference to a specific, simplified example. Thus, FIG. 3 is a schematic diagram of a basic magnetic field map 10 in the plane from the slice-selection direction 1 and the phase-encoding direction 11. Dashed lines each indicate the center of slices to be recorded M1-M10 in the slice stack.

In the present example, there is a metal ball in the region of the slice M3 that generates a quadrupole-shaped interference field 12, which produces deviations from the actual resonance frequency.

Figure 4:
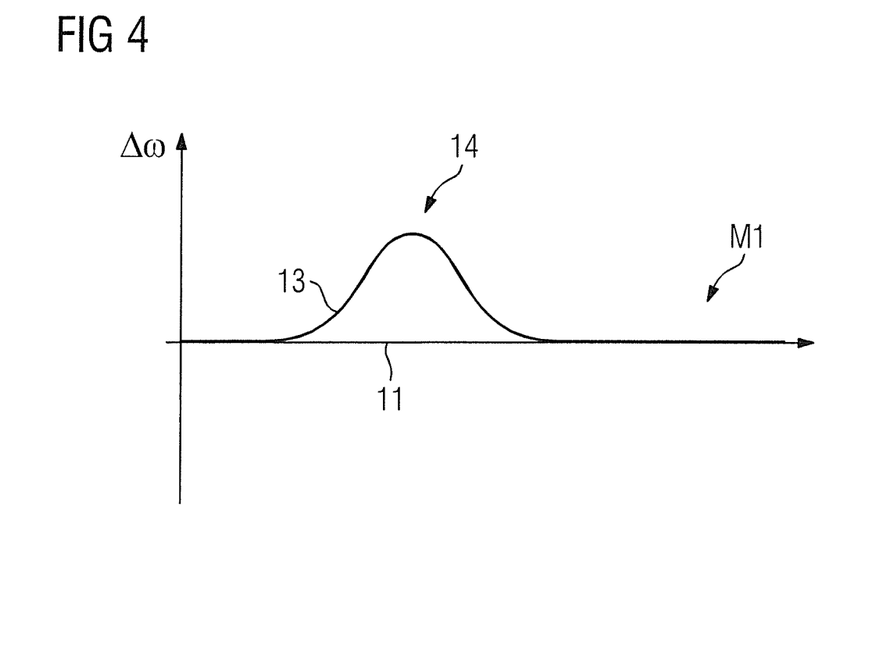
FIG. 4 shows a course of the frequency deviation of the slice M1 from FIG. 3.
Figure 5:
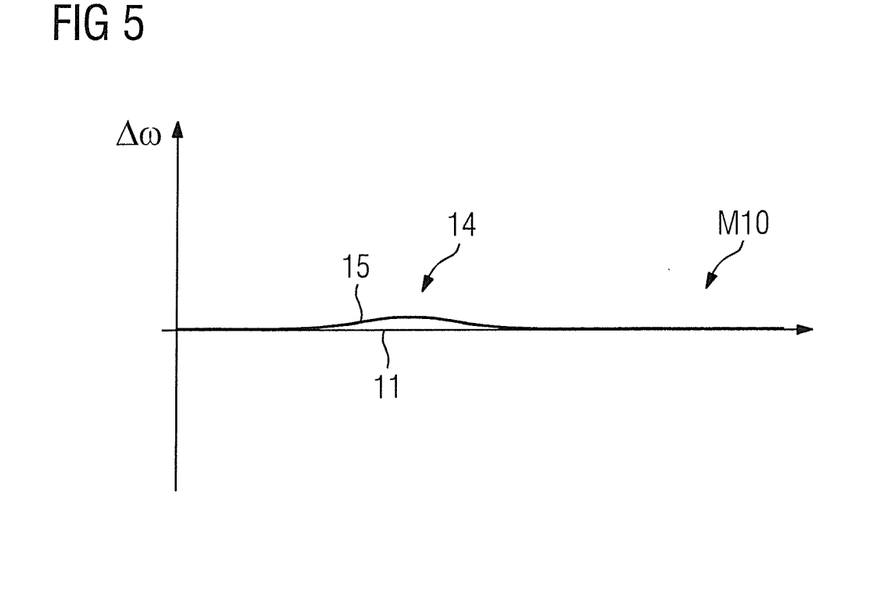
FIG. 5 shows a course of the frequency deviation of the slice M10 from FIG. 3.

The course of the resonance-frequency deviations in the phase-encoding direction 11 now provides information on what will be the main direction of distortion of corresponding slice M1 to M10 due to the metal object. This is shown as an example for the edge slices M1 and M10 in the FIGS. 4 and 5. As is clearly evident from FIG. 4, the course of the resonance frequency deviation 13 for the slice M1 shows a clear deviation from the theoretical resonance frequency with a homogeneous basic magnetic field in a region 14. The means that in the case of a slice selection gradient increasing in strength from right to left, signal extinctions would be expected at least in the region 14. The course of the resonance frequency deviation 15 for the slice M10, which is shown in FIG. 5, also shows in the region 14 a slight positive deviation, but which, if at all, should only result in extremely low signal extinctions if the slice selection gradient is switched such that it increases from left to right.

Figure 6:
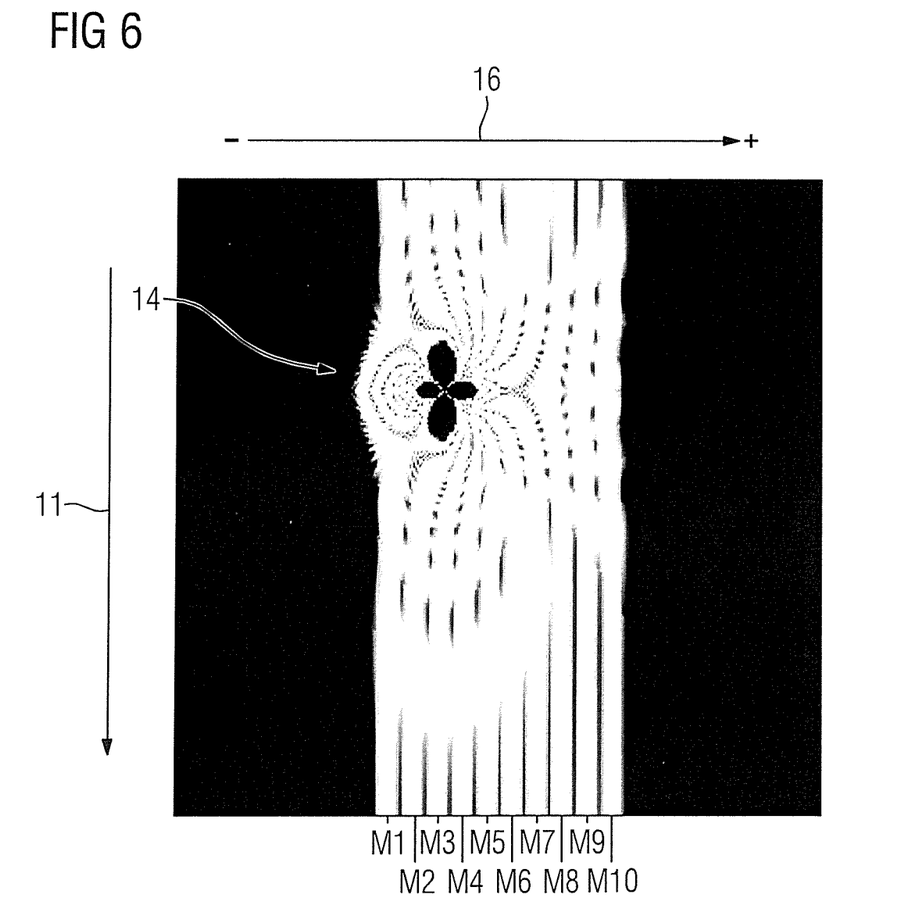
FIG. 6 shows a magnetic resonance image acquired with a first polarity of the slice selection gradient.
Figure 7:
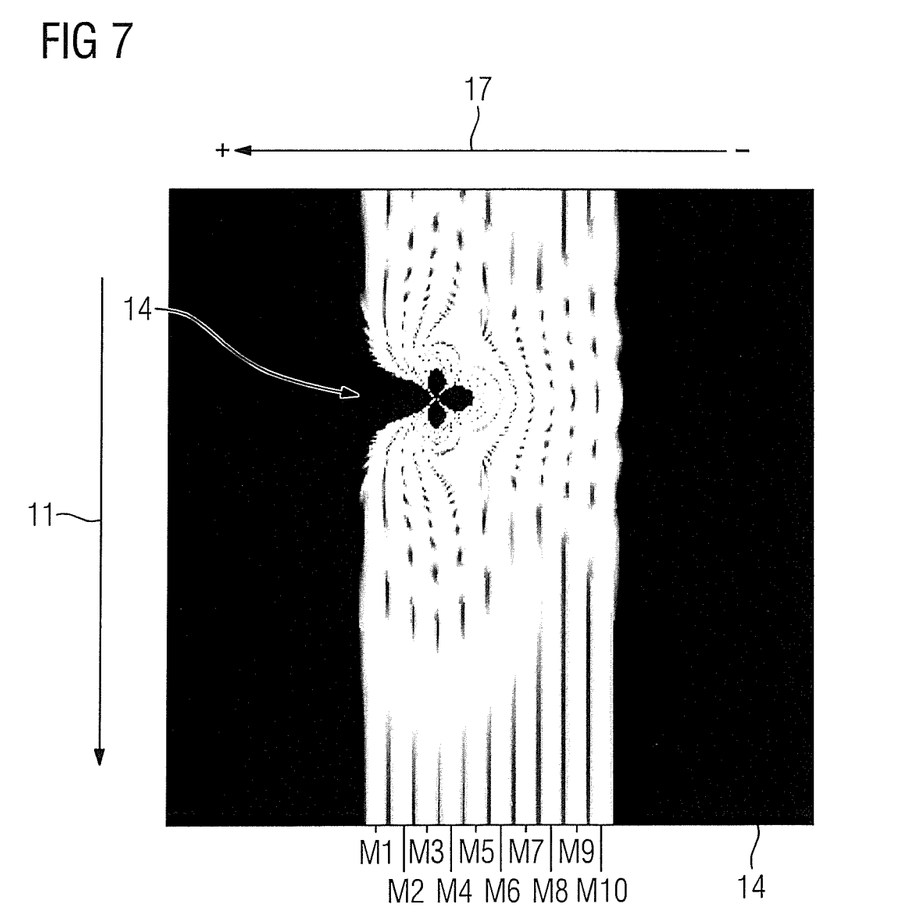
FIG. 7 shows a recorded magnetic resonance image acquired with a second polarity of the slice selection gradient.

This is explained again in more detail in FIGS. 6 and 7 for the example of the distortion shown in FIG. 3. These show for the distorted slices M1-M10 where data are recorded. As the arrow 16, for the case in FIG. 6, the slice selection gradient is switched such that it increases in the slice-selection direction from left to right. However, in FIG. 7, the polarity is reversed, as indicated by the arrow 17. Here, therefore, the slice selection gradient therefore increases from right to left.

It can be clearly seen in FIG. 7 that the extinctions occur at least in the slice M1, but possibly also in the further outermost edge slices M2 and M3 adjacent to the slice M1. Here, incidentally, due to the close proximity to the metal object, the distortion effect is also greater. However, with the reverse polarity of the slice selection gradient, FIG. 6, the data are present in the region 14; signal extinction would be avoided.

There are evidently no signal extinctions with respect to the slice M10 in the visible region.

Figure 8:
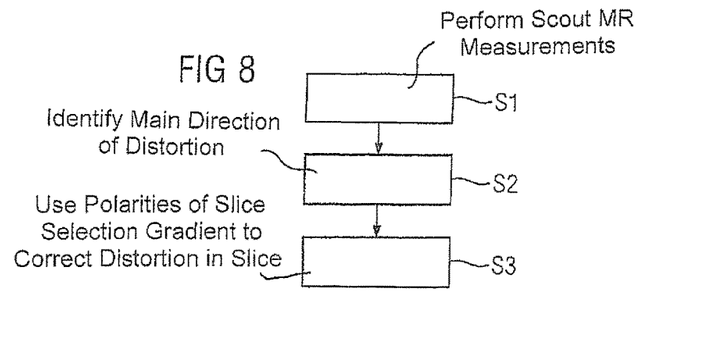
FIG. 8 is a flowchart of an embodiment of the method according to the invention.
Figure 9:
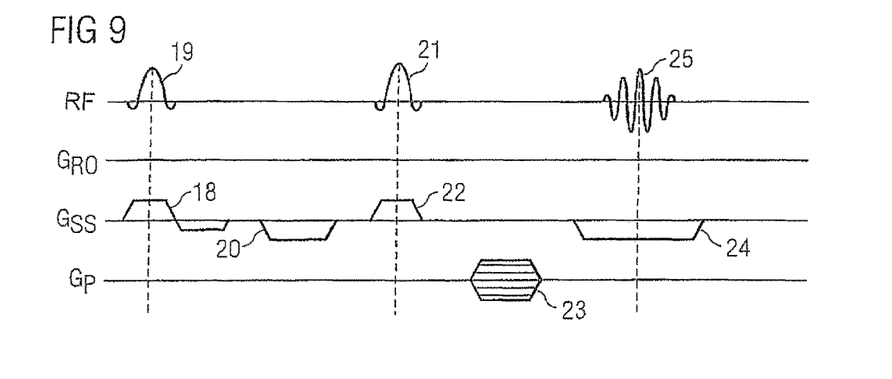
FIG. 9 is a sequence diagram of a scout magnetic resonance measurement.

A specific exemplary embodiment of the method according to the invention will now be explained in more detail with respect to FIG. 8. First, in a step S1, scout (i.e., non-diagnostic quality) magnetic resonance measurements are performed in order to obtain the courses of the resonance frequency deviation in phase-encoding direction 11 in a real application. To this end, in the present case, a magnetic resonance sequence is used to determine a resonance frequency deviation, as shown in FIG. 9 and also described in the post-published German patent application DE 10 2013 205 930.2. There, a radio-frequency excitation pulse 19 is irradiated jointly with a slice selection gradient 18 in order to excite the slice to be measured. Then, a dephasing gradient 20 is applied before a refocusing pulse 21 is applied together with a further gradient 22. After the application of a phase-encoding gradient 23 for spatial encoding, a read-out gradient 24 is applied with which the measuring signals 25 are acquired.

If a number of measuring signals 25 are acquired for the same radio-frequency excitation pulse 19, a gradient that rephases the phase-encoding gradient 23 is switched in each case after the read-out gradient 24. This rephasing gradient is in turn followed by a refocusing pulse 21, a phase-encoding gradient 23 and the acquisition of the next measuring signal 25 with a switched-out read-out gradient 24. This partial sequence, which includes the refocusing pulse 21, the phase-encoding gradient 23, the read-out gradient 24 (for the acquisition of the measuring signal 25) and the rephasing gradient, can be repeated many times before a further echo chain is initiated by the irradiation of a further radio-frequency excitation pulse 19.

The special feature of the sequence diagram shown in FIG. 9 is that the read-out gradient 24 is applied in the slice-selection direction, i.e. in the same direction as the slice selection gradient 18, 22, and, on the other, that the slice selection gradient 18, 22 and the read-out gradient 24 have different polarities.

Figure 10:
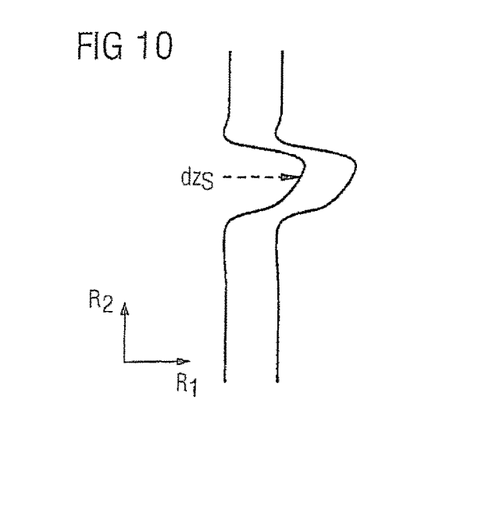
FIG. 10 illustrates a displacement of the slice due to the slice selection gradient.
Figure 11:
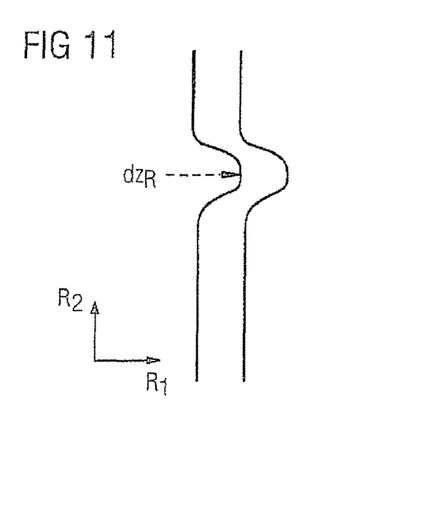
FIG. 11 illustrates a displacement of the slice due to the read-out gradient.

Due to the different polarity of the slice selection gradient 18, 22 and read-out gradient 24, the excited slice is distorted or displaced through both the slice selection gradient 18, 22 and through the read-out gradient 24 in the same direction as that shown in FIGS. 10 and 11. Here, $dz_S$ represents the displacement of the slice due to the slice selection gradient 18, 22 and $dz_R$ the displacement of the slice due to the read-out gradient 24.

Figure 12:
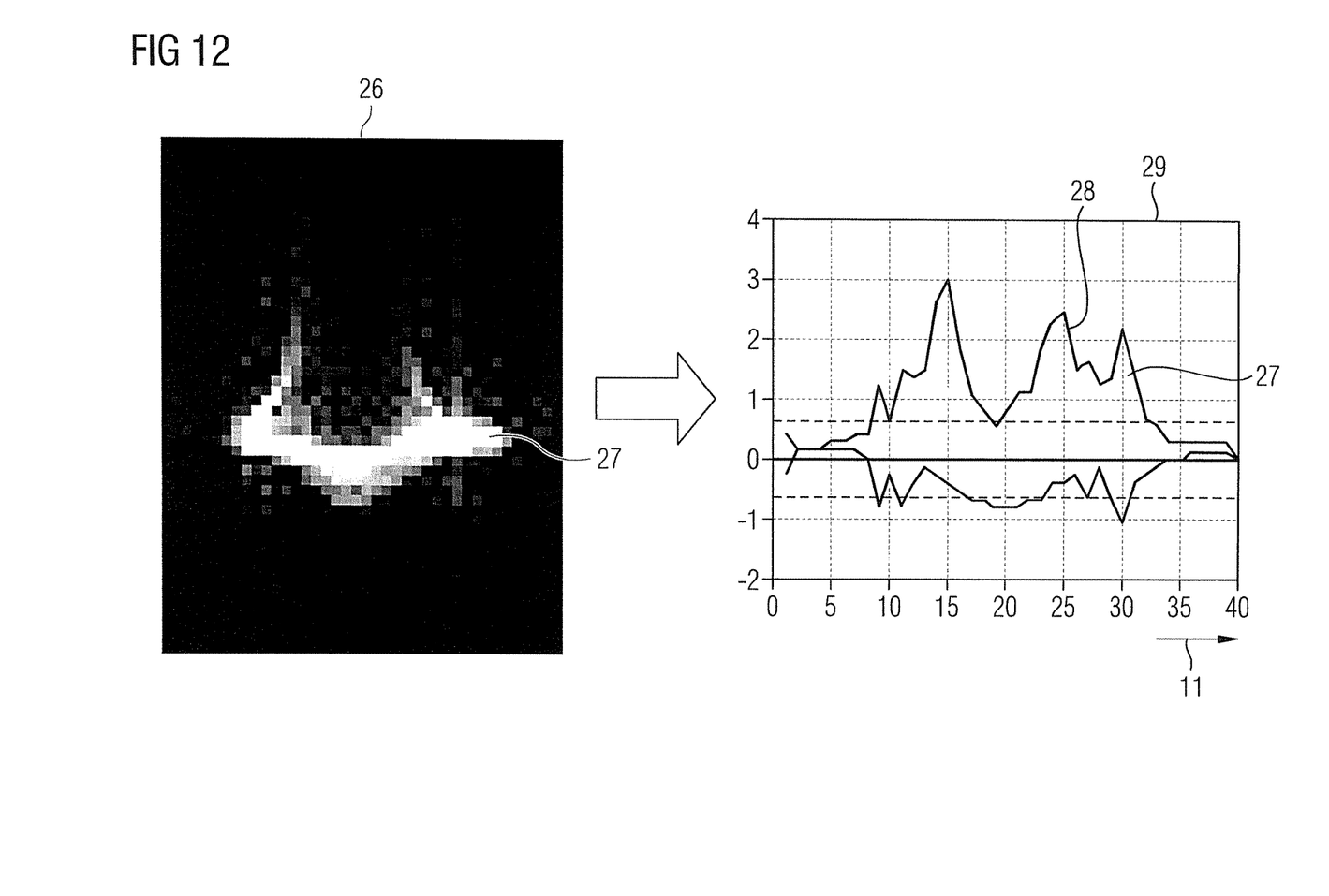
FIG. 12 shows scout data acquired with the sequence in FIG. 9.

If the magnetic resonance sequence shown in FIG. 9 is performed for different settings of the phase-encoding gradient 47, for example in forty phase-encoding steps, the magnetic resonance image 26 shown on the left in FIG. 12 left can be reconstructed from the acquired measuring signals 25 or scout data. This magnetic resonance image 26 is reconstructed from scout data acquired in a slice standing perpendicularly on the slice that is actually excited. The white region 27 in the magnetic resonance image 26 corresponds to image points with a signal intensity greater than a predetermined threshold value.

In the case of a stabile basic magnetic field, the magnetic resonance image 26 would show a white rectangle with a thickness that would correspond to the slice thickness of slice actually excited. However, due to instability of the basic magnetic field induced by the metal object, the actual slice excited is distorted or displaced so that the magnetic resonance image 26 shown in FIG. 12 is produced. Specific methods can now be used to determine the contour 28 of the white region 27 from this magnetic resonance image 26. Here, the scale in the phase-encoding direction 11 represents the forty phase-encoding steps. Since the scout magnetic resonance sequence shown works with a turbo-spin-echo technique, the scout magnetic resonance measurement can be performed quickly.

Here, the graph 29 in FIG. 12, or the contour 28, describes the course of the frequency deviation. The main direction of distortion for this slice can be determined from this or by integration thereof in a step S2 (see FIG. 8 again). This can take place in step S2 for a number of outer edge slices on one side or both sides, wherein, a check is performed for the outermost edge slices that do not lie completely outside as to whether they are actually distorted over the edge of the slice stack. Only then is it relevant to take them into account because only then can signal extinction actually take place.

As a function of this primary direction of distortion (in the example in FIG. 12, as also in FIGS. 4 and 5, clearly the positive direction, therefore toward the left), the polarity of the slice selection gradient can now be selected either slice-by-slice or for all slices, which in the present case likewise takes place in step S2. In a case such as that shown FIG. 4 and FIG. 5, in which anyway virtually no noteworthy signal extinctions occur on one side of the slice stack, it is expedient, to select the same polarity of the slice selection gradient for all slices and to be precise such that no signal extinction takes place on the endangered see the explanations to FIG. 1 and FIG. 2 and FIG. 6 and FIG. 7.

In cases in which there is a possibility of extinctions on both sides of the slice stack, which cannot be cancelled out by the same polarity of the gradient, it is possible to assign slices different polarities from that of the slice selection gradient; however, it is also possible first to record all slices with a polarity of the slice selection gradient when the edge slices now affected by one signal extinction to be then again recorded with the other polarity, for which it is recommended that techniques to accelerate the measurement be used, for example compressed sensing, in order not to prolong the measuring time excessively. In this way, measurements of regions endangered by signal extinction are still performed on both sides of the slice stack.

In a step S3, the polarities are then used to record the magnetic resonance data set. In this case, the SEMAC technique is used to correct the slice distortion throughplane.

Figure 13:
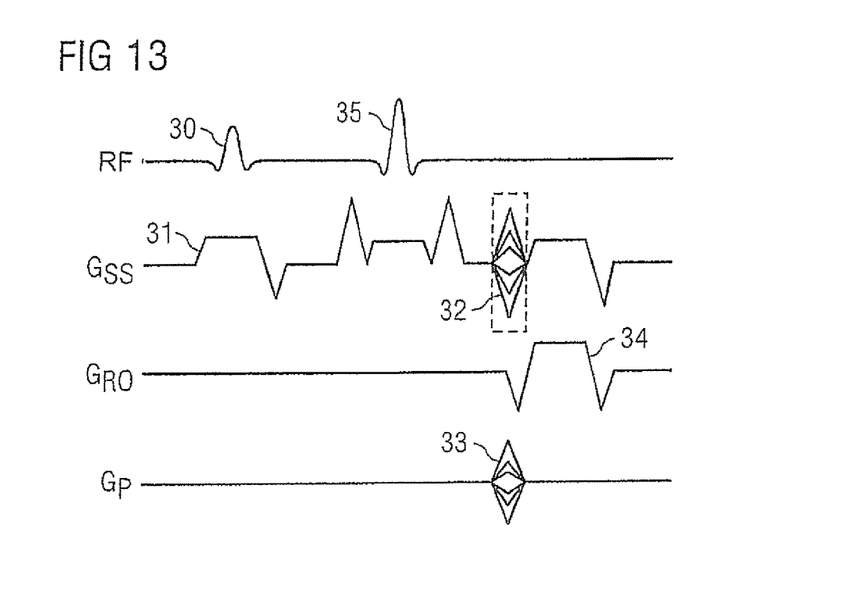
FIG. 13 is a sequence diagram for acquiring magnetic resonance data.

A magnetic resonance sequence used for this is shown in FIG. 13. Similarly to the sequence diagram shown in FIG. 9, the slice is excited with a radio-frequency excitation pulse 30, while a slice selection gradient 31 is switched. For the spatial encoding of the parallel slices, there is a phase-encoding gradient 32 in the slice-selection direction, which is switched simultaneously with the phase-encoding gradient 33 in the phase-encoding direction 11. Here, the phase-encoding direction 11 is obviously perpendicular to the slice-selection direction 1. With this magnetic resonance sequence, the read-out gradient 34 runs in one direction, which is both perpendicular to the slice-selection direction 1 and perpendicular to the phase-encoding direction 11.

Once again, with the magnetic resonance sequence shown in FIG. 13, a refocusing pulse 35 is provided and here, once again, it is possible, to acquire multiple measuring signals with the same radio-frequency excitation pulse 30. In this case, after the read-out gradient 34, it is in turn necessary to switch a gradient that rephases the phase-encoding gradient 32, 33 before a further measuring signal is detected using the partial sequence consisting of the refocusing pulse 35, the phase-encoding gradient 32 and 33 and the read-out gradient 34.

In this context, the data from the scout measurement can also be used to determine the number of phase-encoding steps actually required for each slice. To this end, reference is again made to the post-published DE 10 2013 205 930.2.

Thus, in step S3, magnetic resonance data is obtained with minimized signal extinction.

Figure 14:
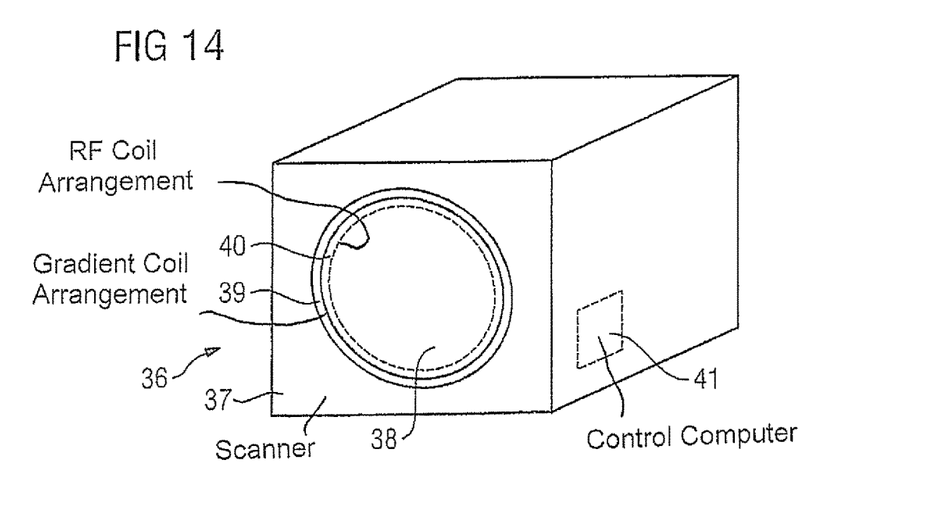
FIG. 14 schematically illustrates a magnetic resonance apparatus according to the invention.

FIG. 14 is a schematic illustration of a magnetic resonance apparatus according to the invention 36. As is in principle known, this has a basic magnetic field unit (scanner) 37 containing the basic field magnetic, and that defines the patient accommodation 38 by which the patient can be introduced on a patient bed (not shown). As is known in principle, the patient accommodation 38 is surrounded by a gradient coil arrangement 39 and a radio-frequency coil arrangement 40. The gradient coil arrangement 39 is used to switch the gradients described herein.

The operation of the magnetic resonance device 36 is controlled by a control computer 41 which can be designed (programmed) to carry out the method according to the invention. Therefore, the storage medium encoded with programming instructions according to the invention is able to be executed be the control computer 41.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring a magnetic resonance (MR) data set from a target area of a patient wherein said target area has at least one metallic object therein, said metallic object producing a distortion, due to susceptibility differences, in a basic magnetic field generated by an MR scanner in which said patient is situated, said MR scanner comprising an arrangement of gradient coils, said method comprising:

in a control computer that operates said MR scanner, designing a slice selection gradient for operating said gradient coil system in order to select a slice, within a stack of slices in said target area, from which said MR data are to be acquired;

in said control computer, designing said slice selection gradient to increase in one direction and, for at least one outermost edge slice situated on one side of said slice stack, selecting a polarity of said slice selection gradient dependent on a primary direction of said distortion in said outermost edge slice;

in said control computer, generating gradient coil control signals configured to operate said arrangement of gradient coils so as to cause said arrangement of gradient coils to activate said slice selection gradient designed by said computer: and from said control computer, providing control signals, including said gradient coil control signals, to said MR scanner and thereby operating said MR scanner so as to execute an MR data acquisition sequence that includes activating said slice selection gradient designed by said control computer so as to acquire MR data from said target area with said distortion being counteracted by said slice selection gradient designed by said computer, and making the acquired MR data available in electronic form, as a data file, from said control computer.

2. A method as claimed in claim 1 wherein said distortion of said basic magnetic field produces a primarily positive resonance frequency deviation for nuclear spins in said target area from which said MR data originate, and comprising, in said control computer, designing said slice selection gradient to increase from said one side of said slice stack to an opposite side of said slice stack.

3. A method as claimed in claim 1 comprising, from said control computer, operating said MR scanner to acquire said MR data from all slices in said slice stack with said slice selection gradient having said polarity that was selected dependent on said primary direction of distortion in said outermost edge slice.

4. A method as claimed in claim 3 comprising, from said control computer, operating said MR scanner, after acquiring said MR data from all of said slices in said slice stack, to again acquire MR data from an edge slice in said slice stack at an opposite side of said slice stack from said one edge, with said slice selection gradient having a polarity opposite to the polarity that was determined dependent on said primary direction of distortion of said outermost edge slice at said one side of said slice stack.

5. A method as claimed in claim 4 comprising again acquiring said MR data from said edge slice at said opposite side of said slice stack, when a primary direction of distortion of said basic magnetic field in said edge slice at said opposite side of said stack is opposite to said primary direction of distortion in said outermost edge slice at said one side of said slice stack.

6. A method as claimed in claim 3 comprising again acquiring said MR data from said outermost edge slice at said opposite side of said stack by operating said MR scanner from said control unit with an MR data acquisition sequence that reduces a data acquisition time for acquiring said MR data.

7. A method as claimed in claim 1 comprising, when acquiring said MR data, operating said gradient coil system in said MR data acquisition sequence to produce a phase-encoding gradient that phase-encodes said MR data in a phase-encoding direction, and determining said primary direction of distortion by analysis, along said phase-encoding direction, of a resonance frequency distribution of respective resonant frequencies of nuclear spins in said target area from which said MR data originate.

8. A method as claimed in claim 7 comprising analyzing said resonance frequency distribution along said phase-encoding direction slice-by-slice for the respective slices in said slice stack.

9. A method as claimed in claim 7 comprising analyzing said resonance frequency distribution at least for respective edge slices in said slice stack acquire by operating said MR scanner, prior to acquiring said MR data from said slice stack, in a scout data acquisition.

10. A method as claimed in claim 9 comprising operating said MR scanner in said scout MR data acquisition using a spin echo sequence.

11. A method as claimed in claim 9 wherein said slice selection gradient is applied during the acquisition of said MR data in a slice selection direction, and comprising operating said MR scanner in said scout MR data acquisition by operating said gradient coil system to apply a readout gradient in said slice selection direction that has a polarity opposite to the polarity of the slice selection gradient.

12. A method as claimed in claim 7 comprising analyzing said resonance frequency distribution by implementing a simulation calculation in said control computer.

13. A method as claimed in claim 1 comprising determining said primary direction of distortion from a property, selected from the group consisting of a property of said target area and a property of said metallic object, acquired from a database accessed by said control computer.

14. A method as claimed in claim 13 wherein said database comprises data representing said property determined by a simulation calculation.

15. A method as claimed in claim 1 comprising selecting said polarity dependent on at least one property, selected from the group consisting of a property of said target area and a property of said metallic object, stored in a database that is accessed by said control computer.

16. A method as claimed in claim 15 wherein said database comprises data representing said property determined by a simulation calculation.

17. A method as claimed in claim 1 comprising, in said control computer, using a SEMAC method to correct said MR data acquired from said slices in said stack with respect to said distortion.

18. A method as claimed in claim 9 comprising, in said scout MR data acquisition, applying said phase-encoding gradient in a selected number of phase-encoding steps, and analyzing said MR data from the respective slices acquired in said scout MR data acquisition using said SEMAC method.

19. A magnetic resonance (MR) apparatus for acquiring a magnetic resonance (MR) data set from a target area of a patient wherein said target area has at least one metallic object therein, said apparatus comprising
  an MR scanner comprising an arrangement of gradient coils and a basic field magnet that generates a basic magnetic field, said metallic object producing a distortion, due to susceptibility differences, in a basic magnetic field;
  a control computer configured to operate said MR scanner while the patient is situated in the MR scanner, said control computer being configured to design a slice selection gradient for operating said gradient coil system in order to select a slice, within a stack of slices in said target area, from which said MR data are to be acquired;
  said control computer being configured to design said slice selection gradient to increase in one direction and, for at least one outermost edge slice situated on one side of said slice stack, selecting a polarity of said slice selection gradient dependent on a primary direction of said distortion in said outermost edge slice;
  said control computer being configured to generate gradient coil control signals configured to operate said arrangement of gradient coils so as to cause said arrangement of gradient coils to activate said slice selection gradient designed by said computer; and
  said control computer being configured providing control signals, including said gradient coil control signals, to said MR scanner and thereby to operate said MR scanner so as to execute an MR data acquisition sequence that includes activating said slice selection gradient designed by said control computer so as to acquire MR data from said target area with said distortion being counteracted by said slice selection gradient designed by said computer, and to make the acquired MR data available in electronic form, as a data file, from said control computer.

20. A non-transitory, computer-readable data storage medium encoded with programming instructions, said data storage medium being loaded into a control computer of a magnetic resonance (MR) apparatus that comprises an MR scanner in which a basic magnetic field is generated and that has an arrangement of gradient coils, said programming instructions causing said control computer to:
  operate said MR scanner to acquire a magnetic resonance data set from a plurality of slices in a slice stack in a target area of a patient situated in the MR scanner, said target area having at least one metallic object therein that distorts, due to susceptibility differences, said basic magnetic field;
  design a slice selection gradient for operating said gradient coil system in order to select a slice, within a stack of slices in said target area, from which said MR data are to be acquired;
  design said slice selection gradient to increase in one direction and, for at least one outermost edge slice situated on one side of said slice stack, selecting a polarity of said slice selection gradient dependent on a primary direction of said distortion in said outermost edge slice;

generate gradient coil control signals configured to operate said arrangement of gradient coils so as to cause said arrangement of gradient coils to activate said slice selection gradient designed by said computer; and providing control signals, including said gradient coil control signals, to said MR scanner and thereby operate said MR scanner to acquire said MR data from said target area in an MR data acquisition sequence that includes activating said slice selection gradient designed by said control computer so as to acquire MR data from said target area with said distortion being counteracted by said slice selection gradient designed by said computer, and make the acquired MR data available in electronic form, as a data file, from said control computer.

* * * * *